US012787244B2

(12) United States Patent
Wang et al.

(10) Patent No.: US 12,787,244 B2
(45) Date of Patent: Nov. 3, 2026

(54) SEMICONDUCTOR DEVICE

(71) Applicant: Socionext Inc., Kanagawa (JP)

(72) Inventors: Wenzhen Wang, Yokohama (JP); Atsushi Okamoto, Yokohama (JP); Hirotaka Takeno, Yokohama (JP)

(73) Assignee: Socionext Inc., Kanagawa (JP)

( * ) Notice: Subject to any disclaimer, the term of this patent is extended or adjusted under 35 U.S.C. 154(b) by 389 days.

(21) Appl. No.: 18/602,522

(22) Filed: Mar. 12, 2024

(65) Prior Publication Data

US 2024/0224491 A1 Jul. 4, 2024

Related U.S. Application Data

(63) Continuation of application No. PCT/JP2022/036486, filed on Sep. 29, 2022.

(60) Provisional application No. 63/261,845, filed on Sep. 30, 2021.

(51) Int. Cl.
*H10B 10/00* (2023.01)
*H10D 84/80* (2025.01)

(52) U.S. Cl.
CPC ............. *H10B 10/18* (2023.02); *H10D 84/80* (2025.01)

(58) Field of Classification Search
CPC ........ H10B 10/18; H10B 10/00; H10D 84/80; H10D 84/00; H10D 83/038
See application file for complete search history.

(56) References Cited

U.S. PATENT DOCUMENTS

| | | | | |
|---|---|---|---|---|
| 8,670,265 | B2 | 3/2014 | Deng | |
| 10,170,413 | B2 | 1/2019 | Ohtou et al. | |
| 10,446,224 | B2 | 10/2019 | Yamaoka et al. | |
| 2005/0162919 | A1* | 7/2005 | Nii | G11C 5/14 365/185.22 |
| 2005/0212018 | A1 | 9/2005 | Shoellkopf et al. | |
| 2007/0045770 | A1* | 3/2007 | Aoki | H10D 64/257 257/E29.12 |
| 2008/0239780 | A1* | 10/2008 | Sasaki | G11C 5/145 365/51 |

(Continued)

FOREIGN PATENT DOCUMENTS

| | | | | |
|---|---|---|---|---|
| JP | 2005259879 | * | 9/2005 | H05B 3/02 |
| JP | 2008-251835 | | 10/2008 | |

(Continued)

OTHER PUBLICATIONS

International Search Report of Int. Appl. No. PCT/JP2022/036486 dated Dec. 27, 2022.

(Continued)

*Primary Examiner* — Galina G Yushina
(74) *Attorney, Agent, or Firm* — IPUSA, PLLC

(57) ABSTRACT

A semiconductor device includes a peripheral circuit area, a bit cell area, and a separating area positioned between the peripheral circuit area and the bit cell. A first power switch circuit for the peripheral circuit area is connected to a first power supply line, and a second power supply line and a first ground line provided on the substrate; and connects the first power supply line and the second power supply line. The second power switch circuit for the bit cell area is connected to a third power supply line, a fourth power supply line, and a second ground line provided on the substrate; and connects the third power supply line and the fourth power supply line.

11 Claims, 13 Drawing Sheets

(56) References Cited

U.S. PATENT DOCUMENTS

| | | | | |
|---|---|---|---|---|
| 2009/0295463 | A1* | 12/2009 | Katou | H10D 84/907<br>327/534 |
| 2010/0327452 | A1* | 12/2010 | Kobayashi | H10W 70/65<br>257/773 |
| 2013/0294149 | A1* | 11/2013 | Deng | G11C 11/413<br>365/156 |
| 2016/0322097 | A1* | 11/2016 | Shin | G11C 5/14 |
| 2017/0026036 | A1 | 1/2017 | Chiyonobu et al. | |
| 2018/0151494 | A1* | 5/2018 | Ohtou | H10W 20/498 |
| 2018/0158511 | A1* | 6/2018 | Yamaoka | G11C 11/417 |
| 2019/0081029 | A1* | 3/2019 | Okamoto | H10D 89/10 |
| 2020/0135718 | A1 | 4/2020 | Liebmann et al. | |
| 2021/0210468 | A1* | 7/2021 | Takeno | H10D 89/10 |

FOREIGN PATENT DOCUMENTS

| | | |
|---|---|---|
| JP | 2016-035966 | 3/2016 |
| JP | 2017-028085 | 2/2017 |
| WO | 2020/065916 | 4/2020 |

OTHER PUBLICATIONS

Written Opinion of International Searching Authority of Int. Appl. No. PCT/JP2022/036486 dated Dec. 27, 2022.

Office Action mailed on Jul. 28, 2026 issued with respect to the corresponding Japanese Patent Application No. 2023-551857.

* cited by examiner

SEMICONDUCTOR DEVICE

CROSS-REFERENCE TO RELATED APPLICATIONS

This U.S. non-provisional application is a continuation application of and claims the benefit of priority under 35 U.S.C. § 365(c) from PCT International Application PCT/JP2022/036486 filed on Sep. 29, 2022, which is designated the U.S., and is based on and claims priority to U.S. provisional application No. 63/261,845 filed on Sep. 30, 2021, the entire contents of which are incorporated herein by reference.

TECHNICAL FIELD

The present disclosure relates to a semiconductor device.

BACKGROUND ART

In an SRAM (Static Random Access Memory), in the case where arrangement of power supply lines is different between a bit cell area and a peripheral circuit area, in some cases, a separating area is provided to secure spacing between the bit cell area and the peripheral circuit area in plan view. A technique called BPR (Buried Power Rails) has been known, in which the power supply lines are buried in a semiconductor substrate. In order to switch between supply and cutoff of a power supply voltage to a virtual power supply line of an internal circuit, a technique that provides a power switch circuit between a power supply line and a virtual power supply line has been known.

Related Art Documents

Patent Documents

[Patent Document 1] U.S. Pat. No. 10,446,224

[Patent Document 2] U.S. Pat. No. 8,670,265

[Patent Document 3] US Patent Publication No. 2020/0135718

[Patent Document 4] US Patent Publication No. 2018/0151494

[Patent Document 5] US Patent Publication No. 2005/0212018

[Patent Document 6] U.S. Pat. No. 10,170,413

In the case where a power supply line and a ground line using a BPR are provided in an SRAM, detailed technical studies on how to arrange the power switch circuit have not been carried out.

SUMMARY

According to one aspect in the present disclosure, a semiconductor device includes a substrate; a peripheral circuit area including a first power supply line, a second power supply line provided on the substrate, and a first ground line provided on the substrate; a bit cell area including a third power supply line, a fourth power supply line, and a second ground line provided on the substrate; a separating area positioned between the bit cell area and the peripheral circuit area in plan view; a first power switch circuit connected to the first power supply line, the second power supply line, and the first ground line; and a second power switch circuit connected to the third power supply line, the fourth power supply line, and the second ground line, wherein the first power switch circuit includes a first switch transistor electrically connected between the first power supply line and the second power supply line, and wherein the second power switch circuit includes a second switch transistor electrically connected between the third power supply line and the fourth power supply line.

DETAILED DESCRIPTION OF THE INVENTION

Figure 1:
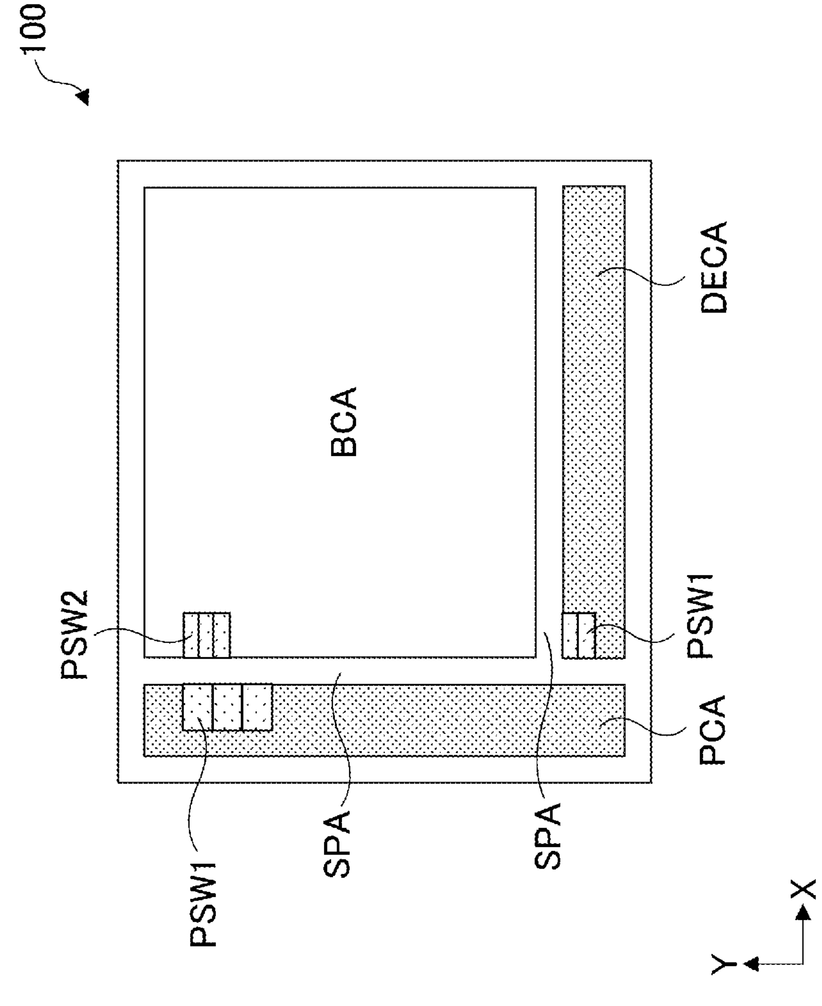
FIG. 1 is a plan view illustrating an overview of a layout of a semiconductor device in a first embodiment.

In the following, embodiments will be described with reference to the drawings.

According to the disclosed techniques, a power supply switch can be appropriately arranged in an SRAM that includes a power supply line and a ground line provided in a substrate.

In the following, a reference numeral denoting a signal may also be used for denoting a signal value, a signal line, or a signal terminal. A reference numeral denoting a power supply may also be used for denoting a power supply voltage, or a power supply line or a power supply terminal to which the power supply voltage is supplied.

First Embodiment

FIG. 1 is a plan view illustrating an overview of a layout of a semiconductor device in a first embodiment. A semiconductor device 100 illustrated in FIG. 1 is, for example, an SRAM. The semiconductor device 100 includes a bit cell area BCA, and a peripheral circuit area PCA and a decoder area DECA arranged peripheral to the bit cell area BCA.

For example, the peripheral circuit area PCA and the bit cell area BCA are arranged side by side in the X direction, and the decoder area DECA and the bit cell area BCA are arranged side by side in the Y direction. The X direction is an example of a first direction. The Y direction is an example of a second direction different from the first direction. In plan view, the separating area SPA is arranged between the bit cell area BCA, the peripheral circuit area PCA, and the decoder area DECA.

For example, respective power supply voltages different from each other are supplied to the bit cell area BCA, the peripheral circuit area PCA, and the decoder area DECA. For example, multiple power supply lines extending in the X direction and arranged side by side in the Y direction are arranged in the bit cell area BCA, the peripheral circuit area PCA, and the decoder area DECA. Note that the positions and arrangement spacing of the power supply lines in the bit cell area BCA, the peripheral circuit area PCA, and the decoder area DECA may be different from one another.

In addition, each of the peripheral circuit area PCA and the decoder area DECA is provided with a predetermined number of power switch circuits PSW1. The bit cell area BCA is provided with a predetermined number of power switch circuits PSW2. Note that one or both of the power switch circuits PSW1 and PSW2 may be arranged in the separating area SPA. The power switch circuit PSW1 is an example of a first power switch circuit. The power switch circuit PSW2 is an example of a second power switch circuit. In the following, in the case where the power switch circuits PSW1 and PSW2 are referred to without distinction, these circuits may also be referred to as the power switch circuit(s) PSW.

Figure 2:
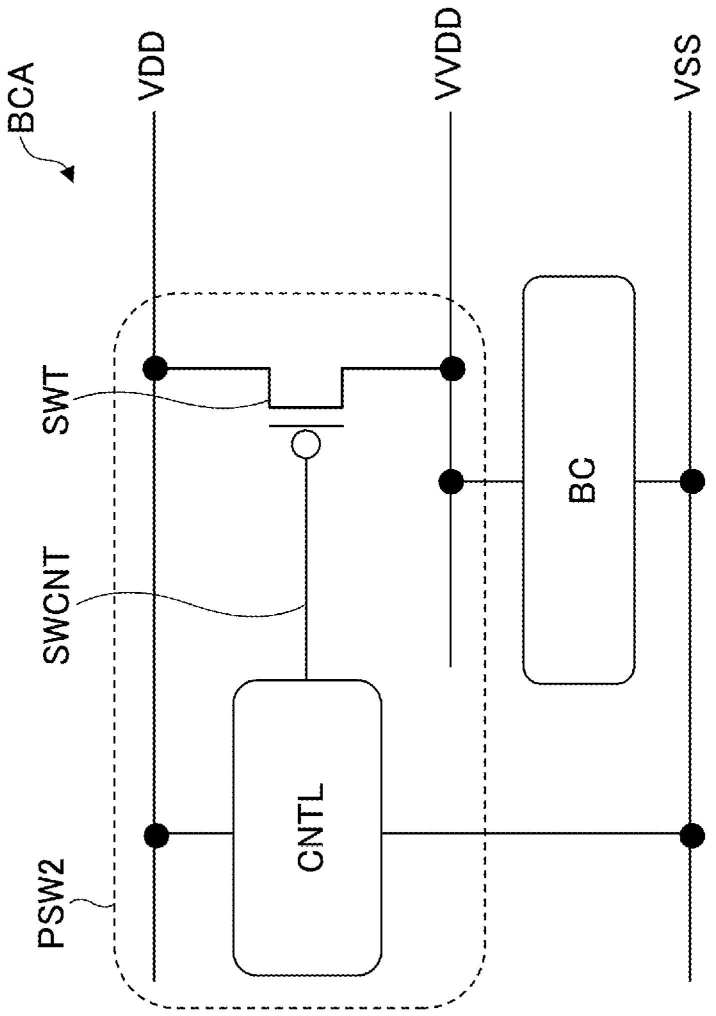
FIG. 2 is a circuit block diagram illustrating an overview of a power switch circuit arranged in a bit cell area in FIG. 1.

FIG. 2 is a circuit block diagram illustrating an overview of the power switch circuit PSW2 arranged in the bit cell area BCA in FIG. 1. Note that the power switch circuit PSW1 arranged in the peripheral circuit area PCA and the decoder area DECA also has substantially the same circuit configuration as in FIG. 2. The bit cell area BCA has multiple bit cells BC (i.e., memory cells). Each bit cell BC is electrically connected to a virtual power supply line VVDD and a ground line VSS, and operates by receiving power from the virtual power supply line VVDD.

The power switch circuit PSW2 includes a switch transistor SWT and a control circuit CNTL. The switch transistor SWT is, for example, a p-channel transistor, and operates by receiving at the gate a switch control signal SWCNT from the control circuit CNTL. Note that although one switch transistor SWT is illustrated in FIG. 2 for the sake of simplification, multiple switch transistors SWT may be arranged between a power supply line VDD and the virtual power supply line VVDD.

While the switch transistor SWT is on, the power supply line VDD and the virtual power supply line VVDD are electrically connected, and the power supply voltage VDD is supplied to the virtual power supply line VVDD. While the switch transistor SWT is off, the electrical connection between the power supply line VDD and the virtual power supply line VVDD is cut off, and the virtual power supply line VVDD is set to a floating state.

The control circuit CNTL is, for example, a buffer circuit. In the case of causing the SRAM to operate, the control circuit CNTL sets the switch control signal SWCNT to a low level, to supply the power supply voltage from the power supply line VDD to the virtual power supply line VVDD. In the case of causing the SRAM to stop operating, the control circuit CNTL sets the switch control signal SWCNT to a high level to stop supplying the power supply voltage from the power supply line VDD to the virtual power supply line VVDD.

Figure 3:
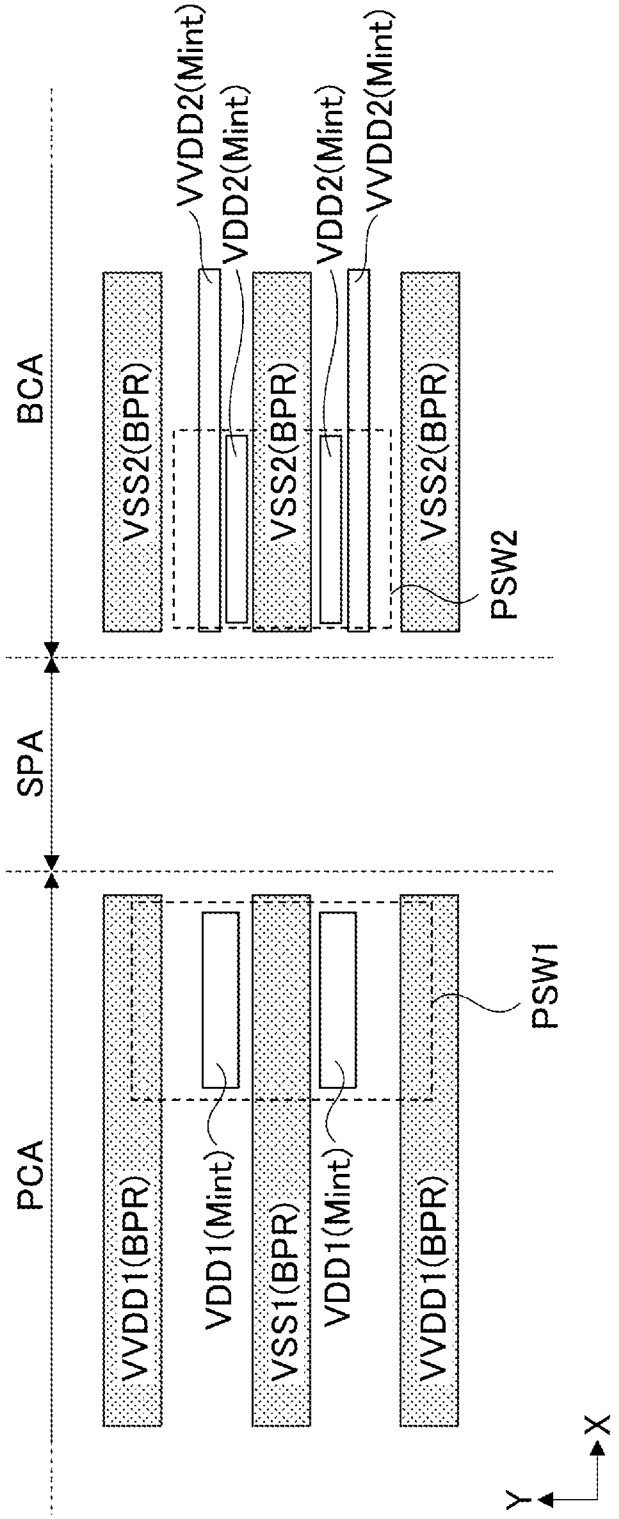
FIG. 3 is a plan view illustrating an example of a layout of power supply lines in an area where power switch circuits in FIG. 1 are arranged.

FIG. 3 is a plan view illustrating an example of a layout of power supply interconnects in the area where the power switch circuits PSW1 and PSW2 in FIG. 1 are arranged. FIG. 3 is an enlarged view of an area where the power switch circuits PSW1 and PSW2 are arranged at the boundary between the peripheral circuit area PCA and the bit cell area BCA in FIG. 1. In the example illustrated in FIG. 3, interconnects of the Mint layer and interconnects of the BPR are respectively provided extending in the X direction. For example, the Mint layer is provided above the semiconductor substrate.

Circuits arranged in the peripheral circuit area PCA and the decoder area DECA are electrically connected to the virtual power supply line VVDD1 and the ground line VSS1. A bit cell arranged in the bit cell area BCA is electrically connected to the virtual power supply line VVDD2 and the ground line VSS2.

In the following, a power supply line, a virtual power supply line, and a ground line routed in the peripheral circuit area PCA or the decoder area DECA are denoted by reference numerals VDD1, VVDD1, and VSS1, respectively. A power supply line, a virtual power supply line, and a ground line routed in the bit cell area BCA are denoted by reference numerals VDD2, VVDD2, and VSS2, respectively. In addition, in the following, reference numerals BPR, LI, or Mint in parentheses after a power supply line name or a ground line name indicate a layer in which a power supply line name or a ground line name is provided.

The power supply line VDD1 is an example of a first power supply line. The power supply line VVDD1 is an example of a second power supply line. The ground line VSS1 is an example of a first ground line. The power supply line VDD2 is an example of a third power supply line. The power supply line VVDD2 is an example of a fourth power supply line. The ground line VSS2 is an example of a second ground line.

Note that a power switch circuit PSW common to two or three of the bit cell area BCA, the peripheral circuit area PCA, and the decoder area DECA may be provided. For example, in the case where the power domains of the peripheral circuit area PCA and the bit cell area BCA are different, the voltage values of the power supply voltages VDD1 and VDD2 may be different from each other, and the voltage values of the virtual power supply lines VVDD1 and VVDD2 may be different from each other.

In the peripheral circuit area PCA, the virtual power supply line VVDD1 that supplies the power supply voltage to the elements in the peripheral circuit area PCA and the ground line VSS1 that supplies the ground voltage to the elements in the peripheral circuit area PCA are provided using a BPR buried in the semiconductor substrate. The semiconductor substrate is an example of a substrate. In addition, in the peripheral circuit area PCA, the power supply line VDD1 to which the power supply voltage is supplied from the outside is provided as an interconnect of the Mint layer.

In the bit cell area BCA, the ground line VSS2 that supplies the ground voltage to the elements in the bit cell area BCA is provided using a BPR. In addition, in the bit cell area BCA, the power supply line VDD2 to which the power supply voltage is supplied from the outside and the virtual power supply line VVDD2 that supplies the power supply voltage to the elements in the bit cell area BCA are provided as interconnects of the Mint layer. Note that the virtual power supply line VVDD2 may be provided using a BPR instead of the Mint layer. In this case, the ground line VSS2(BPR) routed on both sides in the Y direction in FIG. 3 may be replaced with the virtual power supply line VVDD2(BPR).

The power switch circuit PSW1 of the peripheral circuit area PCA is arranged on the separating area SPA side of the peripheral circuit area PCA, to control on and off of supply of the power supply voltage from the power supply line VDD1 to the virtual power supply line VVDD1. The power switch circuit PSW2 of the bit cell area BCA is arranged on the separating area SPA side of the bit cell area BCA, to control on and off of supply of the power supply voltage from the power supply line VDD2 to the virtual power supply line VVDD2. In addition, the supply of the power supply voltage to the respective elements of the peripheral circuit area PCA and the bit cell area BCA is controlled independently from each other.

For example, the layout illustrated in FIG. 3 is arranged repeatedly in the Y direction. In the bit cell area BCA in which a large number of bit cells BC (FIG. 6 or FIG. 7) are arranged, elements such as transistors may be arranged more densely than in the peripheral circuit area PCA. Therefore, corresponding to the elements arranged at a higher density, the arrangement spacing of the ground lines VSS2(BPR) in the Y direction may be set smaller than the arrangement spacing of the ground lines VSS1(BPR) of the peripheral circuit area PCA in the Y direction.

Therefore, in the peripheral circuit area PCA and the bit cell area BCA, in some cases, the power supply types of the BPRs aligned in the X direction are not the same as each other. Considering the case where the power supply types of the BPRs aligned in the X direction are different (e.g., VVDD1 and VSS2), the spacing of the interconnects of the BPRs in the X direction is set to a distance that is not mutually affected by the power supply, for example, by layout rules.

Figure 4:
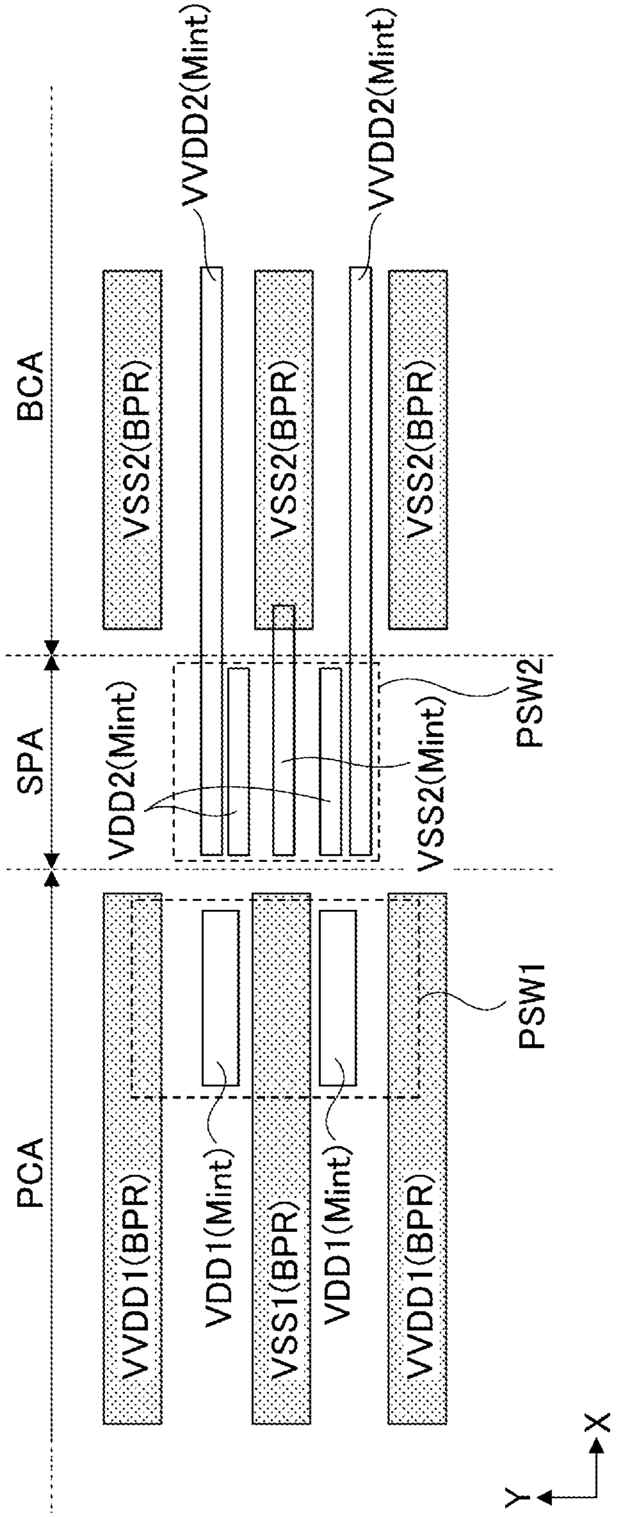
FIG. 4 is a plan view illustrating another example of a layout of the area where the power switch circuits in FIG. 1 are arranged.

FIG. 4 is a plan view illustrating another example of a layout of the area where the power switch circuits in FIG. 1 are arranged. Elements that are substantially the same as in FIG. 3 are assigned the same reference numerals, and detailed description thereof is omitted. FIG. 4 illustrates a layout substantially the same as in FIG. 3, except that the power switch circuit PSW2 is arranged in the separating area SPA, not in the bit cell area BCA.

Note that the separating area SPA is provided to alleviate fluctuations in electrical characteristics caused by differences in arrangement positions in the Y direction of the virtual power supply line VVDD1 and the ground lines VSS1 and VSS2, which are provided using the BPRs in the peripheral circuit area PCA and the bit cell area BCA, respectively. Therefore, it is favorable that the ground line VSS2 using the BPR is not arranged in the separating area SPA.

The power switch circuit PSW2 arranged in the separating area SPA includes the power supply line VDD2, the virtual power supply line VVDD2, and the ground line VSS2 of the Mint layer. The virtual power supply line VVDD2 of the Mint layer extends to the bit cell area BCA along the X direction. The ground line VSS2 of the Mint layer extends along the X direction to the bit cell area BCA and is connected to the ground line VSS2 of the BPR.

As illustrated in FIG. 4, the power supply line VDD2, the virtual power supply line VVDD2, and the ground line VSS2 of the power switch circuit PSW2 are routed using the Mint layer in the separating area SPA, without using the BPR. Accordingly, the power switch circuit PSW2 can be arranged in the separating area SPA while satisfying the layout rules of the spacing of interconnects in the X direction of the BPR provided in each of the peripheral circuit area PCA and the bit cell area BCA. In other words, the power switch circuit PSW2 can be arranged in the separating area SPA without violating the layout rules of interconnects of the BPR.

In addition, by arranging the power switch circuit PSW2 in the separating area SPA, the layout size of the bit cell area BCA can be reduced. By arranging the power switch circuit PSW2 in the separating area SPA being an empty area in which no circuit is arranged, the chip size or layout size of the semiconductor device 100 can be reduced.

The power switch circuit PSW2 is not arranged in the bit cell area BCA, and hence, existing macros of the bit cell area BCA can be reused. As a result, the development cost and the manufacturing cost of an SRAM can be reduced as compared to the case of not reusing the existing macros of the bit cell area BCA.

Figure 5:
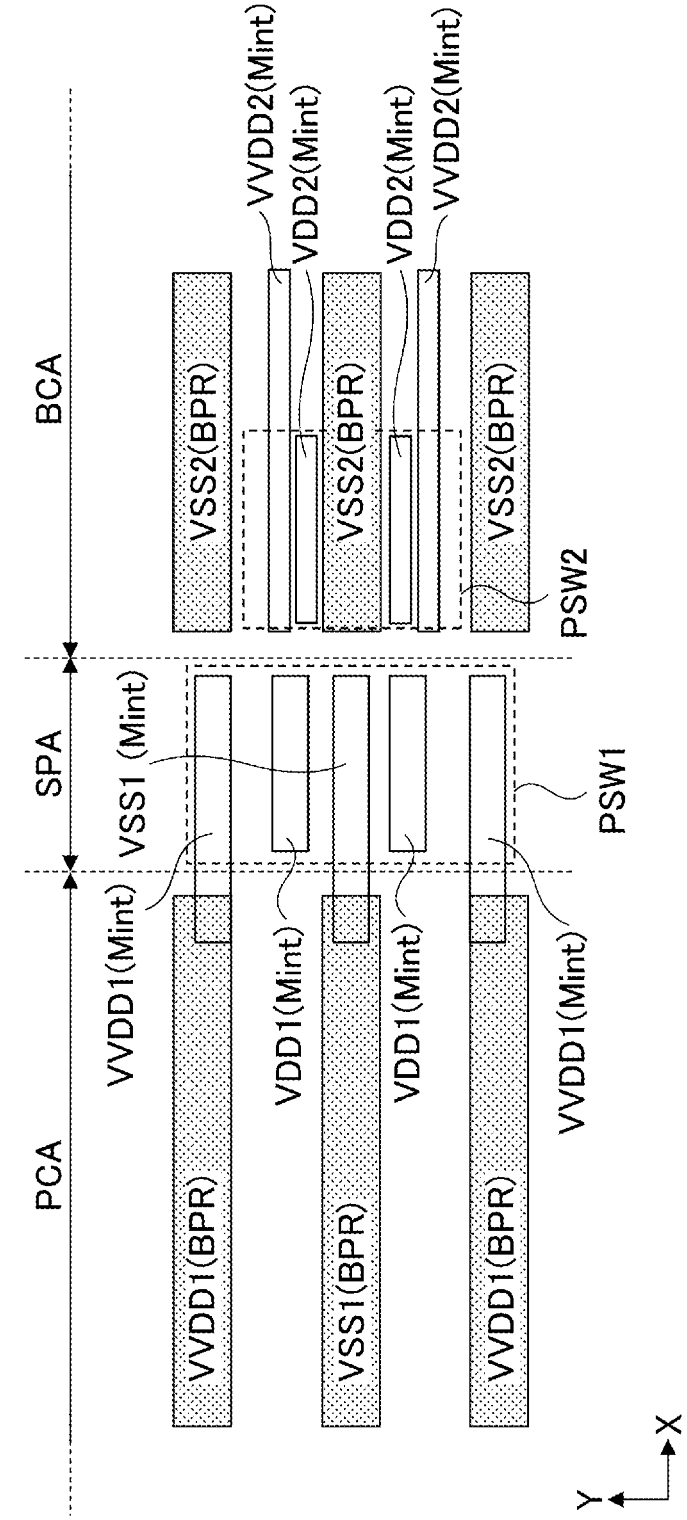
FIG. 5 is a plan view illustrating yet another example of a layout of the area where the power switch circuits in FIG. 1 are arranged.

FIG. 5 is a plan view illustrating yet another example of a layout of the area where the power switch circuits in FIG. 1 are arranged. Elements that are substantially the same as in FIG. 3 are assigned the same reference numerals, and detailed description thereof is omitted. FIG. 5 illustrates a layout substantially the same as in FIG. 3, except that the power switch circuit PSW1 is arranged in the separating area SPA, not in the peripheral circuit area PCA.

The power switch circuit PSW1 arranged in the separating area SPA includes the power supply line VDD1, the virtual power supply line VVDD1, and the ground line VSS1 of the Mint layer. The virtual power supply line VVDD1 of the Mint layer extends along the X direction to the peripheral circuit area PCA, and is connected to the BPR virtual power supply line VVDD1 in the peripheral circuit area PCA. The ground line VSS2 of the Mint layer extends along the X direction to the peripheral circuit area PCA and is connected to the ground line VSS1 of the BPR.

As described above, it is favorable that the ground line VSS1 using the BPR is not arranged in the separating area SPA. Therefore, in FIG. 5, as in FIG. 4, the power supply line VDD1, the virtual power supply line VVDD1, and the ground line VSS1 of the power switch circuit PSW1 are routed using the Mint layer in the separating area SPA, without using the BPR. Accordingly, the power switch circuit PSW1 can be arranged in the separating area SPA while satisfying the layout rules of the spacing of interconnects in the X direction of the BPR. In addition, by arranging the power switch circuit PSW1 in the separating area SPA, the layout size of the peripheral circuit area PCA can be reduced, and the chip size or layout size of the semiconductor device 100 can be reduced.

Figure 6:
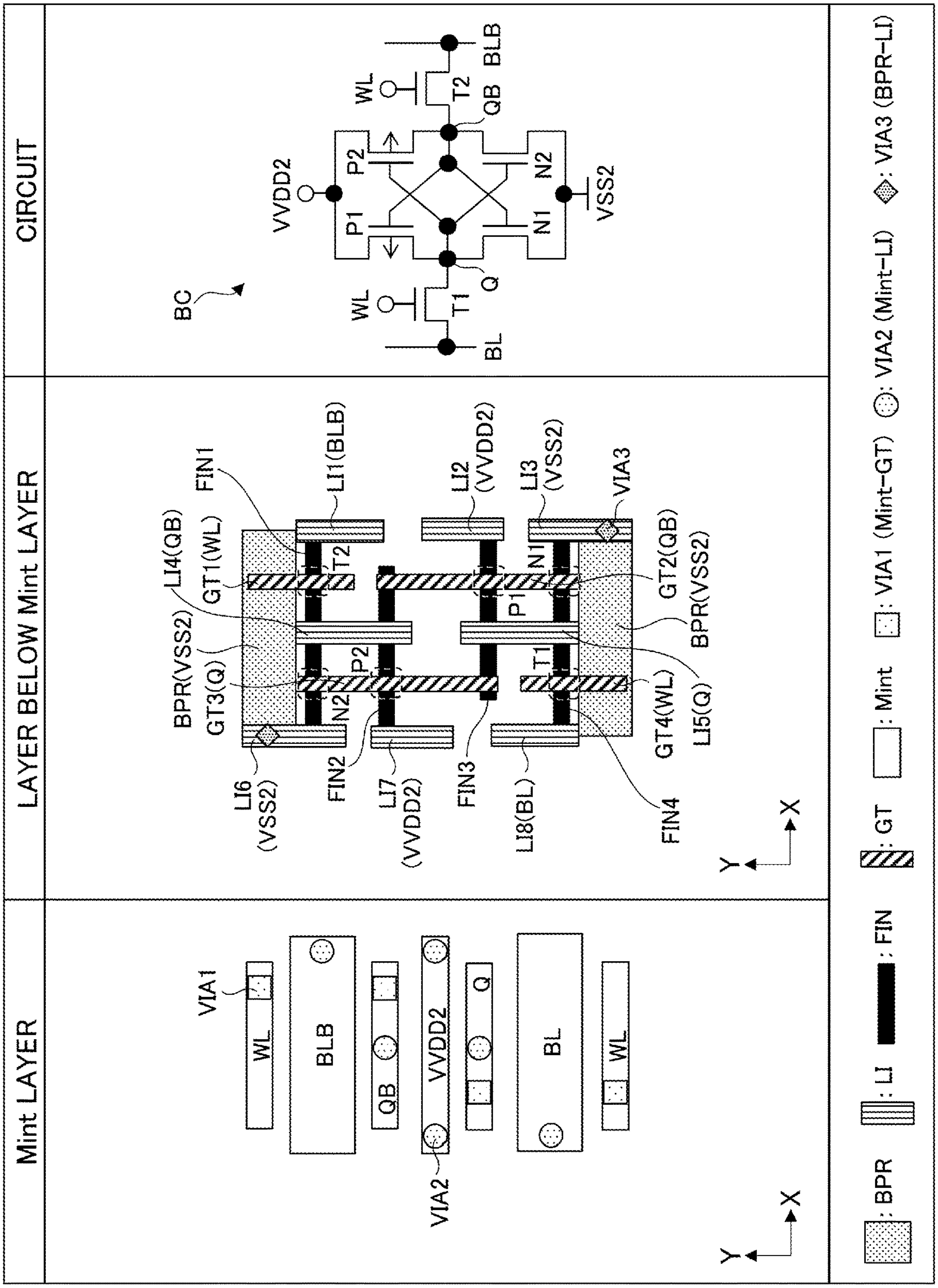
FIG. 6 is a diagram illustrating an example of a bit cell arranged in the bit cell area in FIG. 1.

FIG. 6 is a diagram illustrating an example of the bit cell BC arranged in the bit cell area BCA in FIG. 1. In order to make the layout of the interconnects easier to understand, the left box in FIG. 6 illustrates a layout of interconnects in the Mint layer and vias connected to the Mint layer; and the middle box in FIG. 6 illustrates a layout of interconnects, gates, fins, and vias in a layer below the Mint layer (on the semiconductor substrate side). In addition, the right box in FIG. 6 illustrates a circuit of the bit cell BC. The layouts illustrated in the left and middle boxes in FIG. 6 are positioned to overlap each other in plan view. Note that in FIG. 5, a power supply line name, a ground line name, a signal line name, or a node name are shown in parentheses added after an interconnect layer name or a gate name.

A via VIA1 illustrated as a square connects an interconnect in the Mint layer to a corresponding gate. A via VIA2 illustrated as a circle connects an interconnect in the Mint layer to a local interconnect LI. A via VIA3 illustrated as a diamond connects a local interconnect LI to an interconnect of the BPR. A local interconnect LI and a fin denoted by FIN are connected at positions that overlap in plan view. The local interconnect LI is provided between the semiconductor substrate SUB and the Mint layer.

Rectangular dashed lines illustrated in the middle box in FIG. 6 indicate p-channel transistors P1 and P2, n-channel transistors N1 and N2, and transfer transistors T1 and T2. The transfer transistors T1 and T2 are n-channel transistors. Reference numerals Q and QB illustrated in the left, middle, and right boxes in FIG. 6 indicate complementary storage nodes of the bit cell BC. A storage node Q is connected to a bit line BL through the transfer transistor T1. A storage node QB is connected to a bit line BLB through the transfer transistor T2.

Two word lines WL provided in the Mint layer are connected to gates GT4 and GT1 of the transfer transistors T1 and T2 through vias VIA1, respectively. A virtual power supply line VVDD2 provided in the Mint layer is connected to local interconnects LI2 and LI7 through vias VIA2. The local interconnect LI2 is connected to the source of the p-channel transistor P1. The local interconnect LI7 is connected to the source of the p-channel transistor P2.

An interconnect Q provided in the Mint layer is connected to a local interconnect LI5 and fins FIN3 and FIN4 through vias VIA2, and to a gate GT3 through a via VIA1. The fin FIN3 functions as the source and the drain of the p-channel transistor P1, and the fin FIN4 functions as the source and the drain of the transfer transistor T1 and the n-channel transistor N1.

An interconnect QB provided in the Mint layer is connected to a local interconnect LI4 and fins FIN2 and FIN1 through vias VIA2, and to a gate GT2 through a via VIA1. The fin FIN2 functions as the source and the drain of the p-channel transistor P2, and the fin FIN1 functions as the source and the drain of the transfer transistor T2 and the n-channel transistor N2.

The bit line BLB provided in the Mint layer is connected to the local interconnect LI1 and the fin FIN1 through vias VIA2. The bit line BL provided in the Mint layer is connected to the local interconnect LI8 and the fin FIN4 through vias VIA2. The ground lines VSS2 of the two BPR arranged on both sides in the Y direction in the middle box in FIG. 6 are connected to the local interconnects LI3 and LI6 through vias VIA3, respectively. The local interconnect LI3 is connected to the source of the n-channel transistor N1. The local interconnect LI6 is connected to the source of the n-channel transistor N2.

Figure 7:
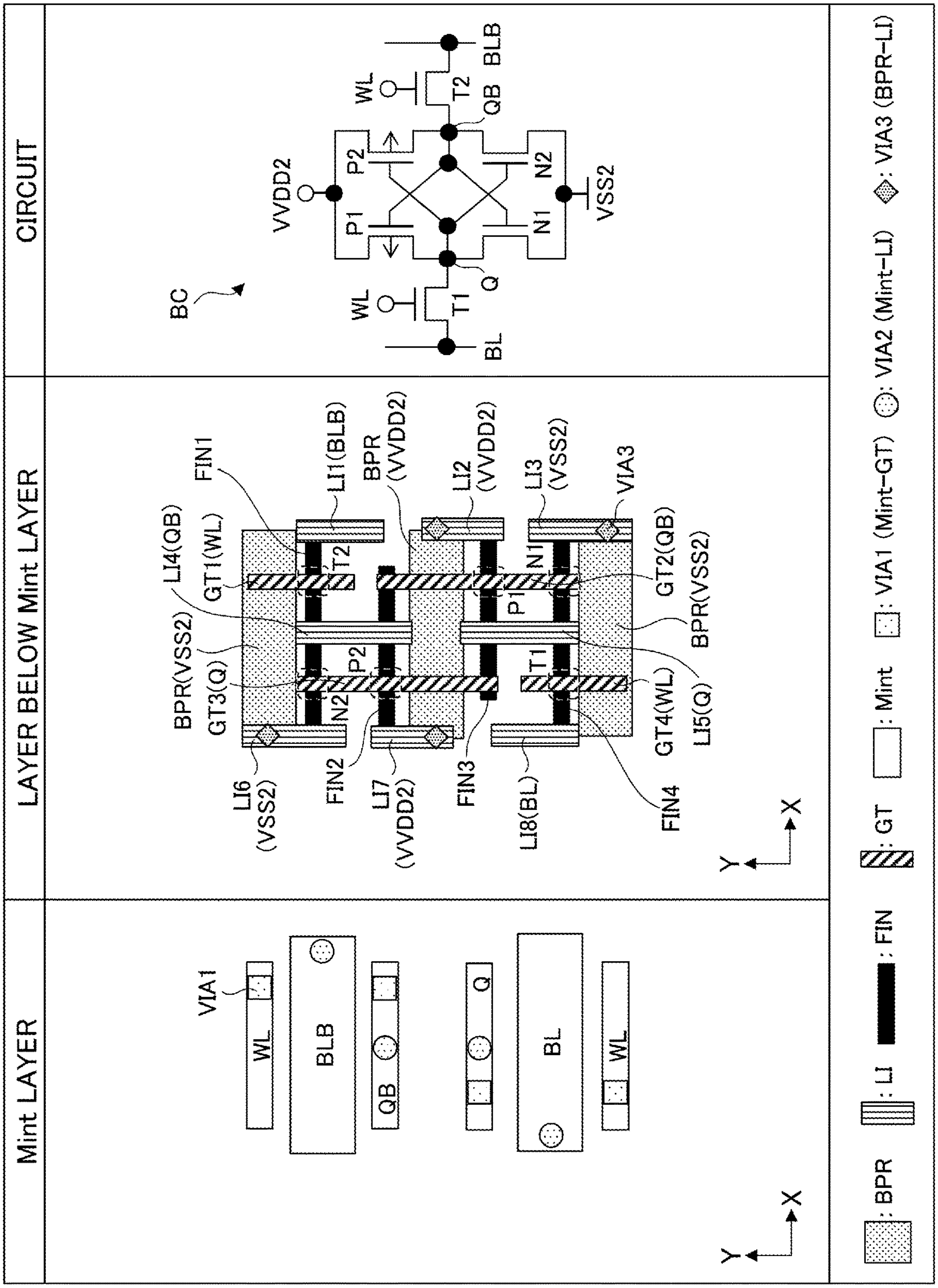
FIG. 7 is a diagram illustrating another example of a bit cell arranged in the bit cell area in FIG. 1.

FIG. 7 is a diagram illustrating another example of the bit cell BC arranged in the bit cell area BCA in FIG. 1. Elements that are substantially the same as in FIG. 6 are assigned the same reference numerals or the same patterns, and detailed description thereof is omitted. FIG. 7 illustrates a layout substantially the same as in FIG. 6 except that the virtual power source line VVDD2 is provided in the BPR.

The virtual power supply lines VVDD2 of the local interconnects LI2 and LI7 are connected to the virtual power supply line VVDD2 of the BPR through vias VIA3. The virtual power supply line VVDD2 of the BPR is arranged between the ground lines VSS2 of the two BPR, and extends in the X direction, similar to the ground lines VSS2 of the two BPR.

Figure 8:
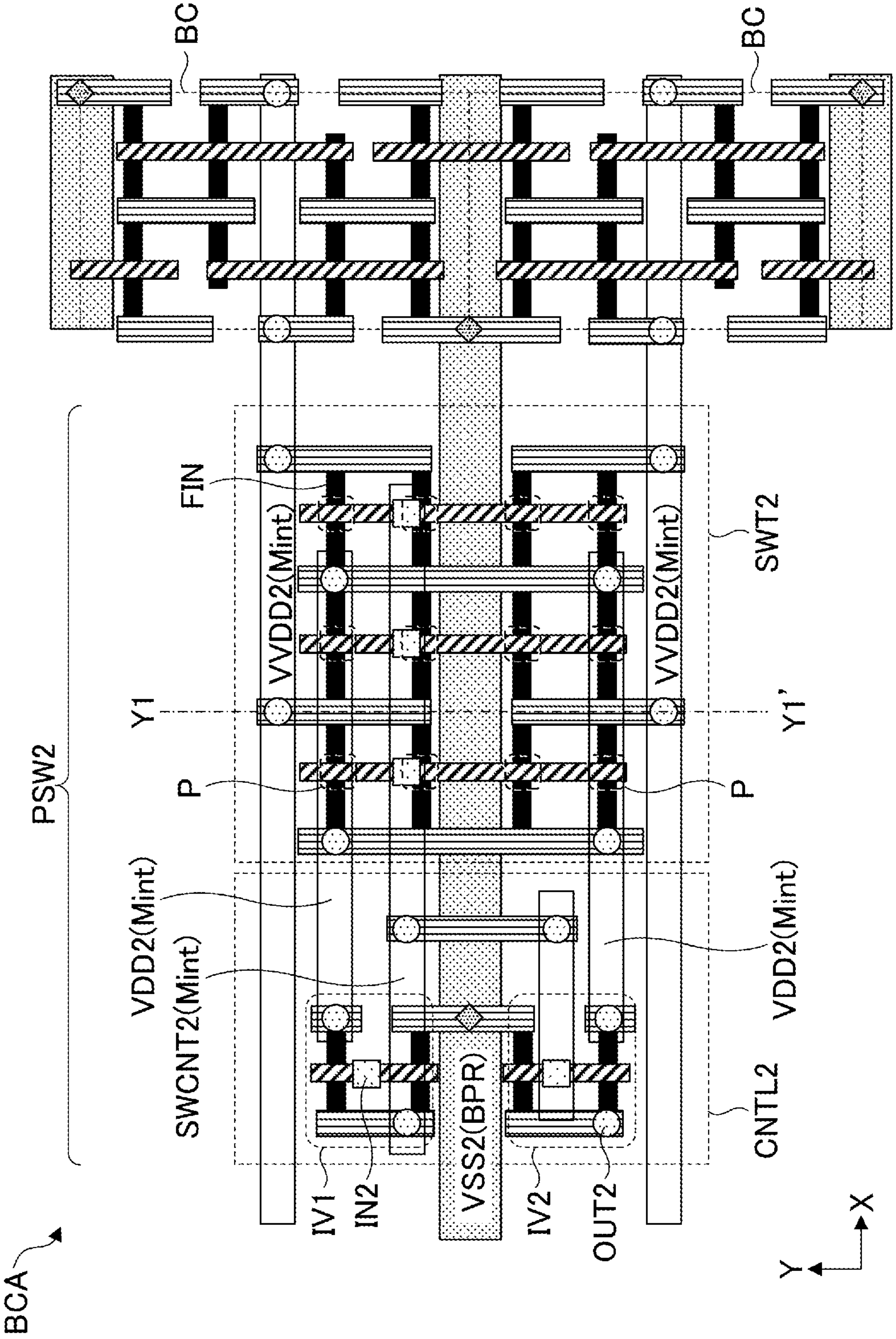
FIG. 8 is a plan view illustrating an example of a layout of a power switch circuit arranged in the bit cell area including the bit cell in FIG. 6.
Figure 9:
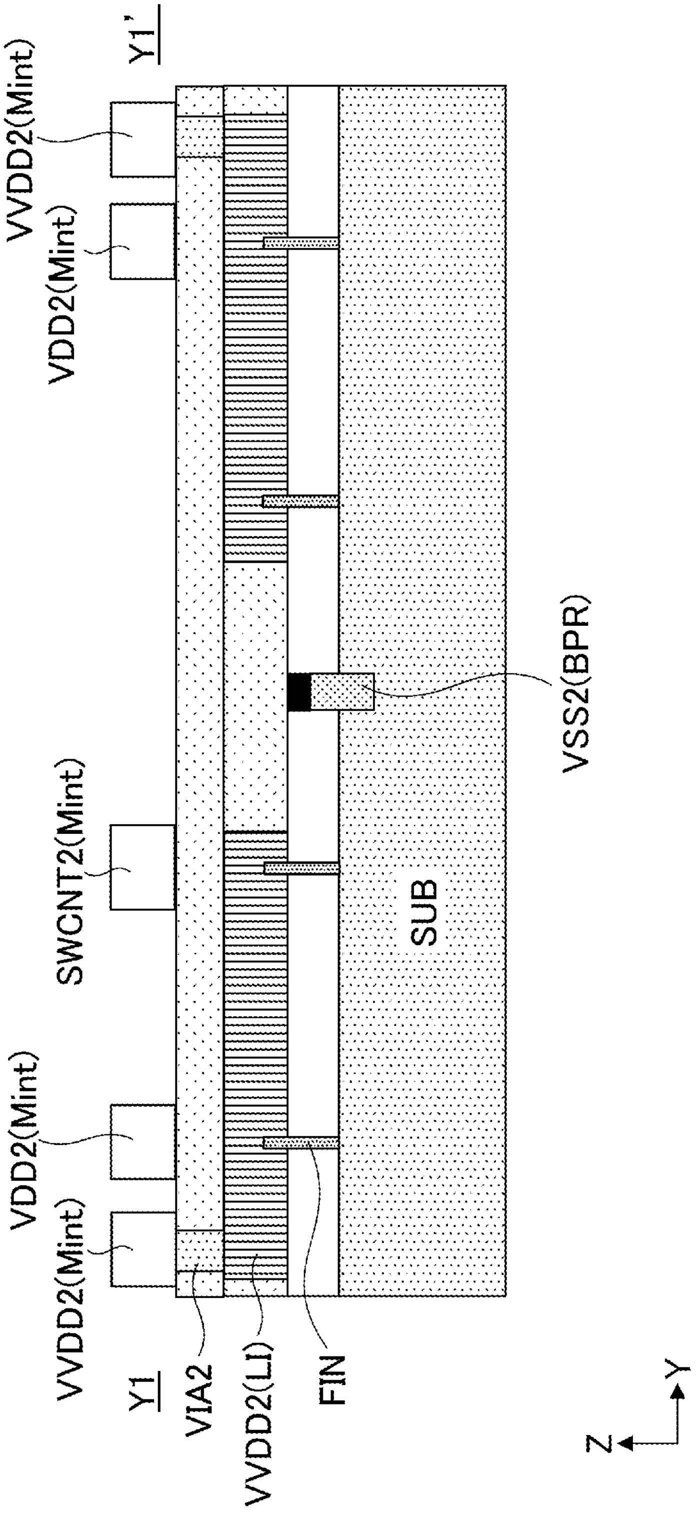
FIG. 9 is a cross-sectional view illustrating a cross section taken along a line Y1-Y1' in FIG. 8.

FIG. 8 is a plan view illustrating an example of a layout of the power switch circuit PSW2 arranged in the bit cell area BCA including the bit cell BC in FIG. 6. FIG. 9 is a cross-sectional view illustrating a cross section taken along a line Y1-Y1' in FIG. 8. The power switch circuit PSW2 includes a control circuit CNTL2 and a switch transistor SWT2. The switch transistor SWT2 is an example of a second switch transistor. The correspondence between interconnect patterns and interconnect types illustrated in FIG. 8 is the same as the correspondence between the interconnect patterns and the interconnect types illustrated in FIGS. 6 and 7.

For example, the bit cells BC illustrated in FIG. 6 are arranged side by side in the Y direction in the bit cell area BCA. At this time, two bit cells BC arranged in the Y direction are arranged in mirror symmetry with the X direction as the axis. Note that in FIG. 8, illustration of part of the interconnects and vias of the bit cell area BCA are omitted.

In the example illustrated in FIG. 8, the power switch circuit PSW2 is arranged adjacent to the bit cell BC of the SRAM in the bit cell area BCA. The power switch circuit PSW2 may be arranged on the separating area SPA side in the bit cell area BCA or on the opposite side to the separating area SPA in the bit cell area BCA as illustrated in FIG. 1. In addition, multiple power switch circuits PSW2 may be arranged in the bit cell area BCA.

Further, as illustrated in FIG. 4, the power switch circuit PSW2 may be arranged in the separating area SPA. In this case, it is favorable that the ground line VSS2 connected to the power switch circuit PSW2 of the separating area SPA is routed in the separating area SPA by using the Mint layer instead of the BPR, and is connected to the ground line VSS2 of the BPR in the bit cell area BCA.

The control circuit CNTL2 includes inverters IV1 and IV2 connected to the power supply line VDD2 of the Mint layer and the ground line VSS2 of the BPR. The inverters IV1 and IV2 operate as buffers. The inverter IV1 inverts the level of a signal received at the input terminal IN2 and outputs the inverted signal as a switch control signal SWCNT2 to the switch control signal line SWCNT2 of the Mint layer. The ground line VSS2 of the BPR connected to the power switch circuit PSW2 is routed by extending the ground line VSS2 of the BPR connected to the bit cell BC.

The switch control signal SWCNT2 is supplied to the gate of the p-channel transistor P of the switch transistor SWT2 and the input terminal of the inverter IV2. The inverter IV2 inverts the level of a signal received at the input terminal and outputs the inverted signal from the output terminal OUT2. For example, a signal output from the output terminal OUT2 is supplied to the input terminal IN2 of the other control circuit CNTL2. The switch control signal SWCNT controls on and off of the p-channel transistor P of the switch transistor SWT, and controls supply of the power supply voltage to the virtual power supply line VVDD2.

The switch transistor SWT2 includes multiple p-channel transistors P each of which has the source connected to the power supply line VDD2, the drain connected to the virtual power supply line VVDD2, and the gate connected to the switch control signal line SWCNT2. Here, the source of the p-channel transistor P is provided on one of fins FIN facing each other having a gate sandwiched in-between. The drain of the p-channel transistor P is provided on the other of the fins FIN opposite to each other and having the gate sandwiched in-between.

The one of the fins FIN is electrically connected to the power supply line VDD2 of the Mint layer, and the other fin FIN is electrically connected to the virtual power supply line VVDD2 of the Mint layer. The virtual power supply line VVDD2 of the Mint layer connected to the switch transistor SWT2 is routed by extending the virtual power supply line VVDD2 of the Mint layer connected to the bit cell BC.

As illustrated in FIG. 8, by extending the virtual power supply line VVDD2 connected to the bit cell BC in the X direction, the virtual power supply line VVDD2 of the switch transistor SWT2 can be used. By extending the ground line VSS2 connected to the bit cell BC in the X direction, the ground line VSS2 of the control circuit CNTL2 can be used. At this time, the virtual power supply line VVDD2 and the ground line VSS2 extending from the bit cell BC can be routed without folding in plan view.

As illustrated in FIG. 9, an interconnect of the Mint layer is connected to a local interconnect LI through a via VIA2. The local interconnect LI is connected to the fin FIN as a part of the switch transistor SWT. The fin FIN is provided on the semiconductor substrate SUB, and the BPR is buried in the semiconductor substrate SUB.

Figure 10:
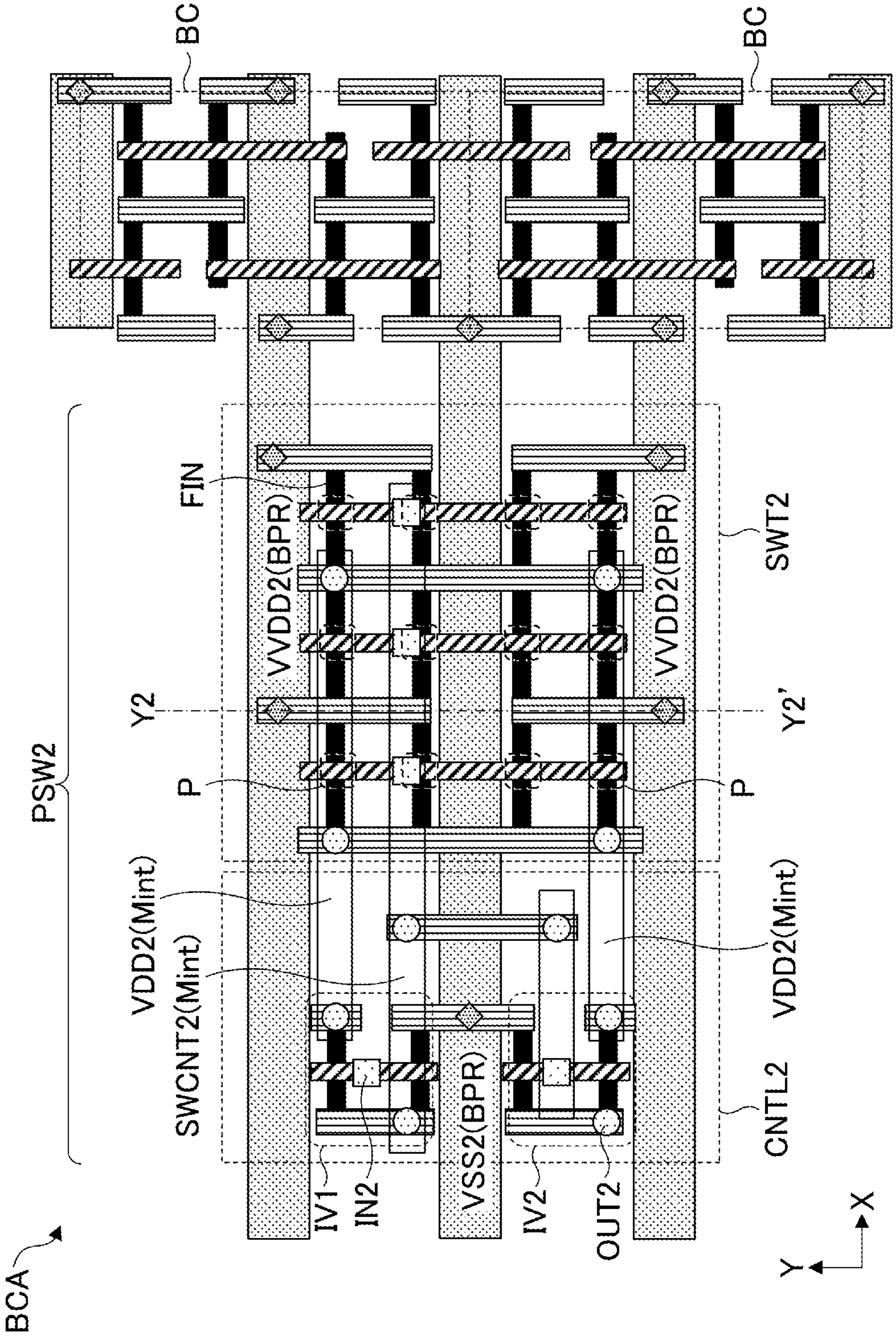
FIG. 10 is a plan view illustrating an example of a layout of a power switch circuit arranged in the bit cell area including the bit cell in FIG. 7.
Figure 11:
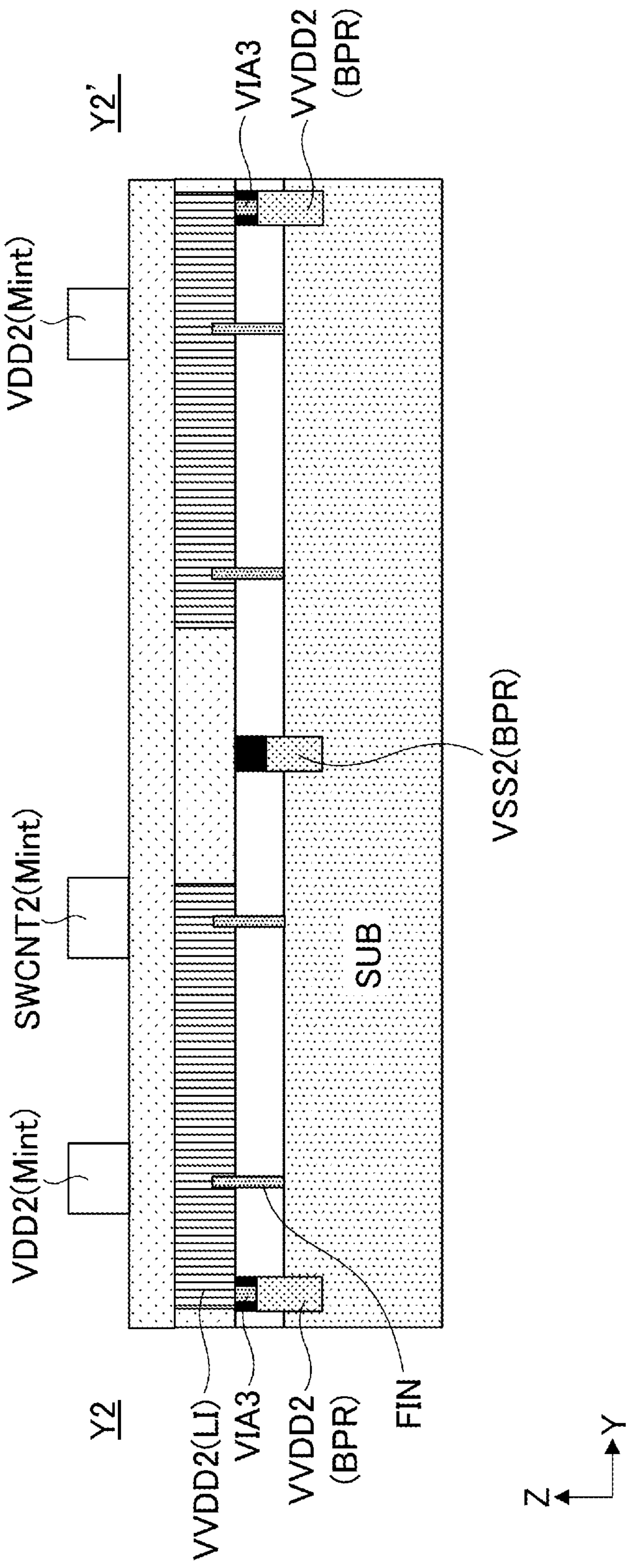
FIG. 11 is a cross-sectional view illustrating a cross section taken along a line Y2-Y2' in FIG. 10.

FIG. 10 is a plan view illustrating an example of a layout of a power switch circuit arranged in the bit cell area BCA including the bit cell BC in FIG. 7. FIG. 11 is a cross-sectional view illustrating a cross section taken along a line Y2-Y2' in FIG. 10. Elements that are substantially the same as in FIGS. 8 and 9 are assigned the same reference numerals or the same patterns, and detailed description thereof is omitted.

FIGS. 10 and 11 illustrate layouts that are substantially the same as in FIGS. 8 and 9, except that the virtual power supply line VVDD2 is provided using a BPR. In other words, as in FIG. 8, the power switch circuit PSW2 is arranged adjacent to the bit cell BC of the SRAM in the bit cell area BCA. By providing the virtual power supply line VVDD2 using a BPR, the interconnect resistance can be reduced, and the capability of supplying the virtual power supply voltage VVDD2 to the bit cell BC can be increased.

Note that as illustrated in FIG. 4, in the case where the power switch circuit PSW2 is arranged in the separating area SPA, the virtual power supply line VVDD2 and the ground line VSS2 of the power switch circuit PSW2 may be routed using the Mint layer rather than a BPR. In this case, for example, the virtual power supply line VVDD2 of the Mint layer of the power switch circuit PSW2 is routed by extending the virtual power supply line VVDD2 of the Mint layer of the bit cell area BCA. For example, the ground line VSS2 of the Mint layer of the power switch circuit PSW2 is connected to the ground line VSS2 of the BPR of the bit cell area BCA.

In FIG. 11, the virtual power supply line VVDD2 of the BPR is connected to the virtual power supply line VVDD2 of the local interconnect LI through a via VIA3 provided in an insulating film arranged on the virtual power supply line VVDD2. In addition, the virtual power supply line VVDD2 of the local interconnect LI is connected to a fin FIN (the drain of the p-channel transistor P).

FIGS. 12A to 12F are diagrams each illustrating an overview of an example of arrangement of the power switch circuit PSW2 arranged in the bit cell area BCA in FIG. 1. In FIGS. 12A to 12F, adjacent to four bit cells BC, the power switch circuit PSW2 is arranged along the Y direction as one direction. Note that the bit cell BC may be arranged repeatedly in the X direction and in the Y direction.

Figure 12A:
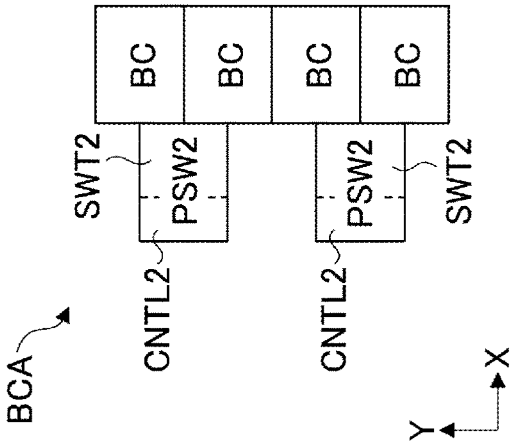
FIGS. 12A to 12F are diagrams each illustrating an overview of an example of arrangement of the power switch circuit arranged in the bit cell area in FIG. 1.

In FIG. 12A, each power switch circuit PSW2 is arranged corresponding to two bit cells BC arranged in the Y direction. In each power switch circuit PSW2, the control circuit CNTL2 and the switch transistor SWT2 are arranged side by side in the X direction. The layout in FIG. 12A is substantially the same as the layout illustrated in FIGS. 8 and 10.

Figure 12B:
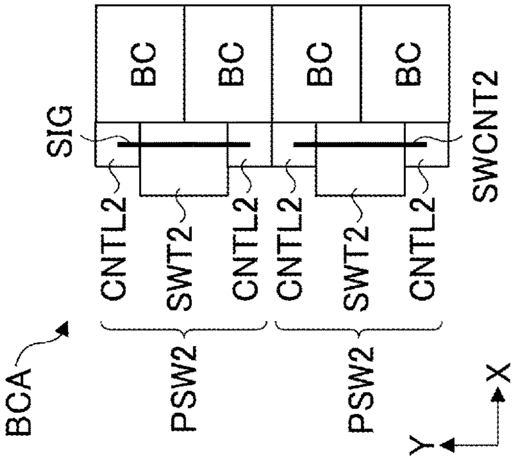

In FIG. 12B, each power switch circuit PSW2 is arranged corresponding to two bit cells BC arranged in the Y direction. The control circuit CNTL2 of each power switch circuit PSW2 is separated into two parts, and arranged on both sides of the switch transistor SWT2 in the Y direction. For example, in the case where the control circuit CNTL2 is a buffer, each of the two inverters is arranged in each control circuit CNTL2. In addition, the output of one inverter and the input of the other inverter are connected by a signal line SIG. The signal line SIG may be routed using an interconnect layer above the Mint layer.

Figure 12C:
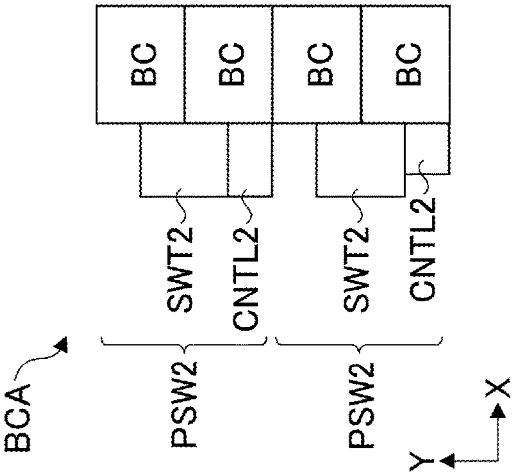

In FIG. 12C, each power switch circuit PSW2 is arranged corresponding to two bit cells BC arranged in the Y direction. The control circuit CNTL2 and the switch transistor SWT2 of each power switch circuit PSW2 are arranged side by side in the Y direction. The width of the control circuit CNTL2 in the X direction is the same or smaller than the width of the switch transistor SWT2. In the case of providing the control circuit CNTL2 having a small driving capacity, the size of the control circuit CNTL2 can be reduced.

Figure 12D:
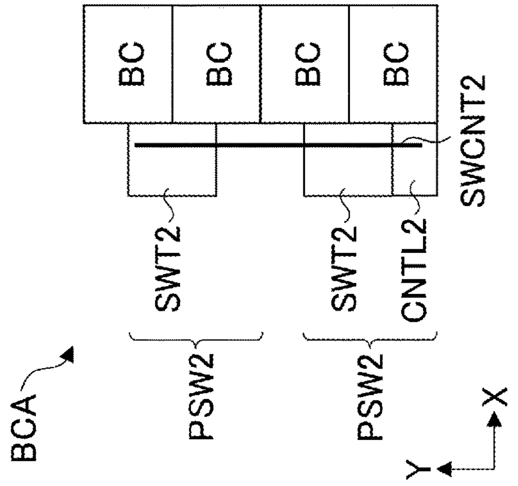

In FIG. 12D, each power switch circuit PSW2 is arranged corresponding to two bit cells BC arranged in the Y direction. However, one of the power switch circuits PSW2 receives a switch control signal SWCNT2 from the other of the power switch circuits PSW2. Therefore, the control circuit CNTL2 is not provided in one of the power switch circuits PSW2, but is provided in the other of the power switch circuits PSW2, which is shared by the two power switch circuits PSW2.

Figure 12E:
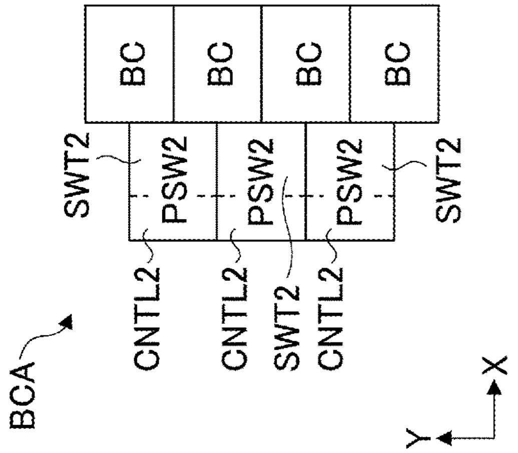

In FIG. 12E, three power switch circuits PSW2 are arranged corresponding to the four bit cells BC arranged in the Y direction. In each power switch circuit PSW2, the control circuit CNTL2 and the switch transistor SWT2 are arranged side by side in the X direction.

Figure 12F:
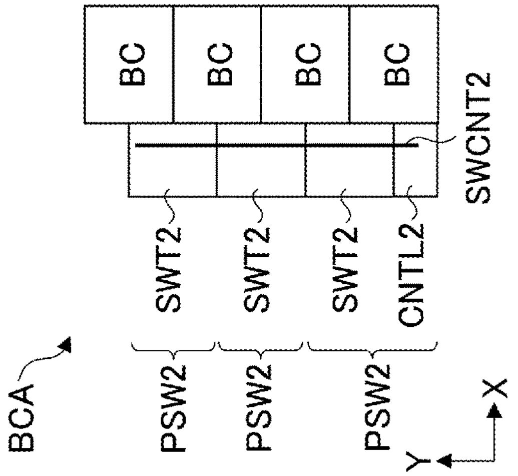

In FIG. 12F, three power switch circuits PSW2 are arranged corresponding to the four bit cells BC arranged in the Y direction. However, two of the power switch circuits PSW2 receive a switch control signal SWCNT2 from the other power switch circuit PSW2. Therefore, the control circuit CNTL2 is provided in one of the power switch circuits PSW2 and shared by the three power switch circuits PSW2.

In FIG. 12B, the width of the power switch circuit PSW2 in the X direction can be smaller than that in FIG. 12A, and hence, the layout size of the bit cell BC can be reduced. In FIGS. 12C, 12D, and 12F, the control circuit CNTL2 can be shared among the multiple power switch circuits PSW2, and hence, the layout size of the bit cell BC can be further reduced. In FIGS. 12E and 12F, the arrangement density of the switch transistor SWT2 in the Y direction can be made higher than those in FIG. 12A and the like, and the supplying capacity of the virtual power supply voltage VVDD2 supplied to the bit cell BC can be increased. In other words, the interconnect resistance of the virtual power supply line VVDD2 can be lowered.

As above, in the present embodiment, the power switch circuits PSW1 and PSW2 can be arranged in the semiconductor device 100 that includes the virtual power supply lines VVDD1 and VVDD2 of the BPR and the ground lines VSS1 and VSS2 of the BPR.

The virtual power supply voltage VVDD1 can be supplied to the peripheral circuit area PCA by the power switch circuit PSW1 arranged in the peripheral circuit area PCA or separating area SPA. The virtual power supply voltage VVDD2 can be supplied to the bit cell area BCA by the power switch circuit PSW2 arranged in the bit cell area BCA or separating area SPA. In other words, even in the case where the virtual power supply voltages VVDD1 and VVDD2 have different voltage values, the virtual power supply voltage VVDD1 can be supplied to the peripheral circuit area PCA, and the virtual power supply voltage VVDD2 can be supplied to the bit cell area BCA.

By arranging the power switch circuit PSW2 in the separating area SPA, the layout size of the bit cell area BCA can be reduced. As a result, the chip size or layout size of the semiconductor device 100 can be reduced. By routing the power supply line VDD2, the virtual power supply line VVDD2, and the ground line VSS2 of the power switch circuit PSW2 using the Mint layer in the separating area SPA, the power switch circuit PSW2 can be arranged in the separating area SPA without violating the layout rules of interconnects of the BPR.

By routing the virtual power supply line VVDD2 using a BPR, the interconnect resistance can be reduced, and the capability of supplying the virtual power supply voltage VVDD2 to the bit cell BC can be increased.

Second Embodiment

Figure 13:
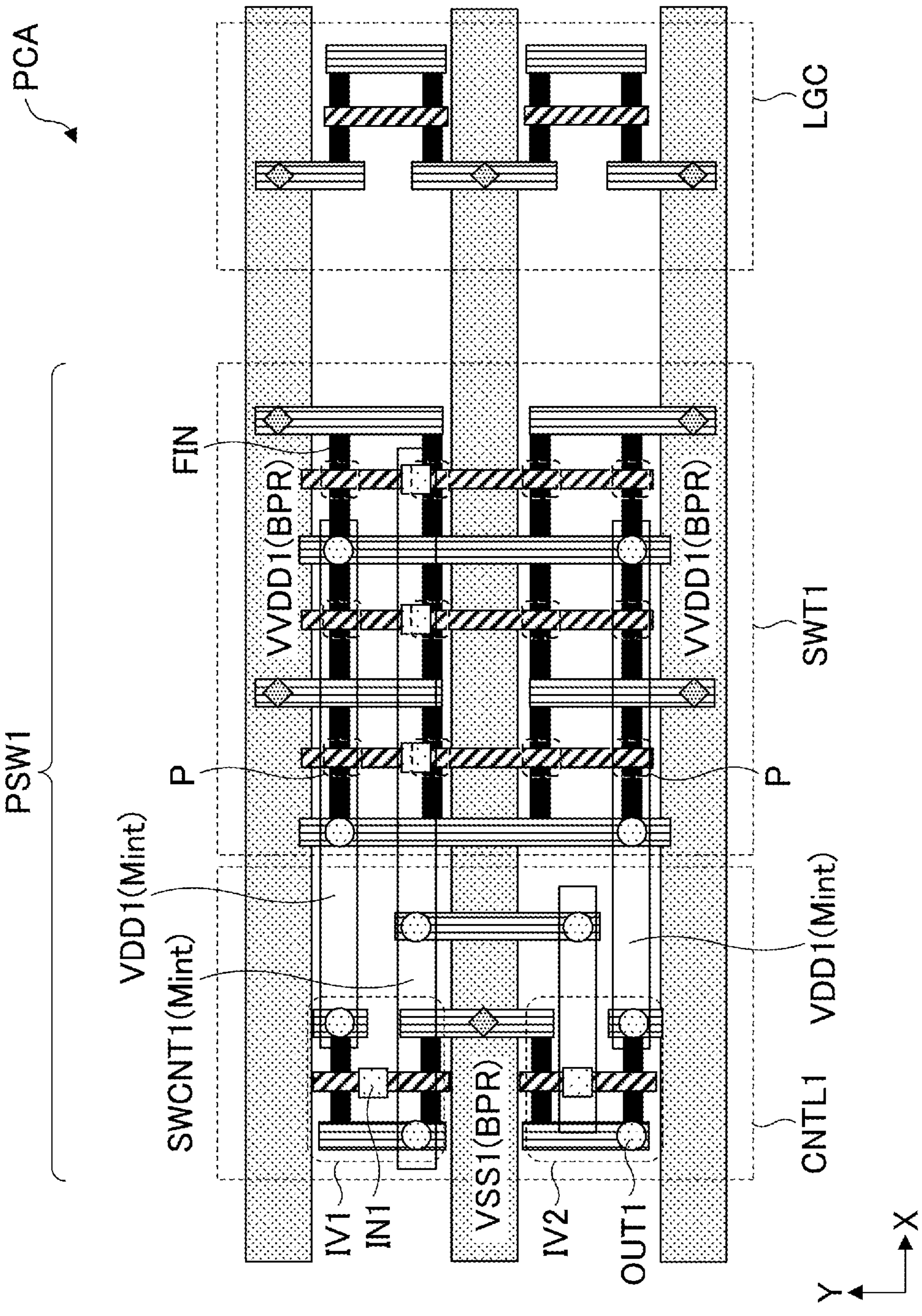
FIG. 13 is a plan view illustrating an example of a layout of the power switch circuit arranged in the peripheral circuit area of a semiconductor device in a second embodiment.

FIG. 13 is a plan view illustrating an example of a layout of the power switch circuit PSW1 arranged in the peripheral circuit area PCA of a semiconductor device in a second embodiment. Elements that are substantially the same as in FIG. 10 are assigned the same reference numerals or the same patterns, and detailed description thereof is omitted. The power switch circuit PSW1 includes a control circuit CNTL1 and a switch transistor SWT1. The switch transistor SWT1 is an example of a first switch transistor. The layout of the control circuit CNTL1 is the same as the layout of the control circuit CNTL2 in FIG. 10, except that the types of signal lines, power supply lines, and ground lines are different. Note that the circuit configuration and the layout of the power switch circuit PSW1 of the decoder area DECA illustrated in FIG. 1 are the same as in FIG. 13.

In the example illustrated in FIG. 10, the power switch circuit PSW1 is arranged adjacent to a circuit LGC in the peripheral circuit area PCA. The power switch circuit PSW1 may be arranged on the separating area SPA side in the peripheral circuit area PCA or on the opposite side to the separating area SPA in the peripheral circuit area PCA as illustrated in FIG. 1. In addition, multiple power switch circuits PSW1 may be arranged in the peripheral circuit area PCA.

Further, as illustrated in FIG. 5, the power switch circuit PSW1 may be arranged in the separating area SPA. In this case, it is favorable that the ground line VSS1 connected to the power switch circuit PSW1 of the separating area SPA is routed in the separating area SPA by using the Mint layer instead of the BPR, and is connected to the ground line VSS1 of the BPR in the peripheral circuit area PCA.

The control circuit CNTL1 includes inverters IV1 and IV2 connected to the power supply line VDD1 of the Mint layer and the ground line VSS1 of the BPR. The inverters IV1 and IV2 operate as buffers. The inverter IV1 inverts the level of a signal received at the input terminal IN1 and outputs the inverted signal as a switch control signal SWCNT1 to the switch control signal line SWCNT1 of the Mint layer. The ground line VSS1 of the BPR connected to the power switch circuit PSW1 is routed by extending the ground line VSS1 of the BPR connected to the circuit LGC provided in the peripheral circuit area PCA.

The switch control signal SWCNT1 is supplied to the gate of the p-channel transistor P of the switch transistor SWT1 and the input terminal of the inverter IV2. For example, a signal output from the output terminal OUT1 of the inverter IV2 is supplied to the input terminal IN2 of the other control circuit CNTL2.

The switch transistor SWT1 includes multiple p-channel transistors P each of which has the source connected to the power supply line VDD1, the drain connected to the virtual power supply line VVDD1, and the gate connected to the switch control signal line SWCNT1. The source of the p-channel transistor P is provided on one of fins FIN facing each other having a gate sandwiched in-between. The drain of the p-channel transistor P is provided on the other fin FIN facing the source having the gate sandwiched in-between.

One of the fins FIN is electrically connected to the power supply line VDD1 of the Mint layer, and the other fin FIN is electrically connected to the virtual power supply line VVDD1 of the BPR. The virtual power supply line VVDD1 of the BPR connected to the switch transistor SWT1 is routed by extending the virtual power supply line VVDD1 of the BPR connected to the circuit LGC provided in the peripheral circuit area PCA.

As illustrated in FIG. 10, by extending the virtual power supply line VVDD1 connected to the circuit LGC in the X direction, the virtual power supply line VVDD1 of the switch transistor SWT1 can be used. By extending the ground line VSS1 connected to the circuit LGC in the X direction, the ground line VSS1 of the control circuit CNTL1 can be used. At this time, the virtual power supply line VVDD1 and the ground line VSS1 extending from the circuit LGC can be routed without folding in plan view. As above, the same effects can be obtained also in this embodiment as in the first embodiment.

As above, the present inventive concept has been described based on the respective embodiments; note that the present disclosure is not limited to the requirements set forth in the embodiments described above. These requirements can be changed to the extent that they do not depart from the gist of the present inventive concept, and can be suitably defined according to applications.

What is claimed is:

1. A semiconductor device comprising:

a substrate;

a peripheral circuit area including a first power supply line, a second power supply line at least a part of which is buried in the substrate, and a first ground line at least a part of which is buried in the substrate;

a bit cell area including a third power supply line, a fourth power supply line, and a second ground line at least a part of which is buried in the substrate;

a separating area positioned between the bit cell area and the peripheral circuit area in a plan view;

a first power switch circuit connected to the first power supply line, the second power supply line, and the first ground line; and a second power switch circuit connected to the third power supply line, the fourth power supply line, and the second ground line, wherein the first power switch circuit includes a first switch transistor electrically connected between the first power supply line and the second power supply line, and wherein the second power switch circuit includes a second switch transistor electrically connected between the third power supply line and the fourth power supply line.

2. The semiconductor device as claimed in claim 1, wherein the peripheral circuit area includes a plurality of first ground lines each extending in a first direction in the plan view, wherein the bit cell area includes a plurality of second ground lines each extending in the first direction, and wherein arrangement spacing of the plurality of first ground lines in a second direction, which is different from the first direction in the plan view, is different from arrangement spacing of the plurality of second ground lines in the second direction.

3. The semiconductor device as claimed in claim 1, wherein the second power switch circuit is positioned in the separating area in the plan view.

4. The semiconductor device as claimed in claim 3, wherein the fourth power supply line extends from the bit cell area to the separating area using an interconnect layer above the substrate, and wherein the second ground line is electrically connected to the second power switch circuit through a portion of the second ground line provided in the separating area using the interconnect layer above the substrate.

5. The semiconductor device as claimed in claim 1, wherein the first power switch circuit is positioned in the separating area in the plan view.

6. The semiconductor device as claimed in claim 5, wherein the first power supply line is electrically connected to a power supply line provided in the separating area using the interconnect layer above the substrate, and wherein the first ground line is electrically connected to the first power switch circuit through a portion of the first ground line provided in the separating area using the interconnect layer above the substrate.

7. The semiconductor device as claimed in claim 1, wherein the fourth power supply line is buried in the substrate.

8. The semiconductor device as claimed in claim 1, further comprising:

a plurality of second power switch circuits arranged along one direction.

9. The semiconductor device as claimed in claim 8, wherein the plurality of second power switch circuits are arranged adjacent to each other.

10. The semiconductor device as claimed in claim 8, wherein each of the plurality of second power switch circuits includes a control circuit to control the corresponding second switch transistor, and wherein the control circuit is arranged on both sides of the second switch transistor in the one direction.

11. The semiconductor device as claimed in claim 8, wherein one of the plurality of second power switch circuits includes a control circuit to commonly control the second switch transistors respectively included in the plurality of second power switch circuits.

* * * * *